United States Patent
Kim et al.

(10) Patent No.: US 8,643,800 B2
(45) Date of Patent: Feb. 4, 2014

(54) LIQUID CRYSTAL DISPLAY DEVICE AND METHOD OF MANUFACTURING THE SAME

(75) Inventors: Sun-Woo Kim, Annyang-si (KR); Jae-Kyun Lee, Goyang-si (KR); Jae-Young Oh, Goyang-si (KR); Dae-Jung Choi, Paju-si (KR)

(73) Assignee: LG Display Co., Ltd, Seoul (KR)

( * ) Notice: Subject to any disclaimer, the term of this patent is extended or adjusted under 35 U.S.C. 154(b) by 210 days.

(21) Appl. No.: 13/100,708

(22) Filed: May 4, 2011

(65) Prior Publication Data
US 2011/0273651 A1    Nov. 10, 2011

(30) Foreign Application Priority Data

May 4, 2010    (KR) ........................ 10-2010-0042018

(51) Int. Cl.
G02F 1/136    (2006.01)
(52) U.S. Cl.
USPC ............................................................ 349/44
(58) Field of Classification Search
USPC ........................................................ 349/44
See application file for complete search history.

(56) References Cited

U.S. PATENT DOCUMENTS

| | | | | |
|---|---|---|---|---|
| 6,115,089 A * | 9/2000 | Hayashi | | 349/39 |
| 2007/0222923 A1* | 9/2007 | Wang et al. | | 349/110 |
| 2011/0063537 A1* | 3/2011 | Kim et al. | | 349/42 |

* cited by examiner

Primary Examiner — Timothy L Rude
(74) Attorney, Agent, or Firm — Brinks Gilson & Lione

(57) ABSTRACT

A liquid crystal display device includes an array substrate including: gate and data lines crossing each other on a first substrate to define a pixel region; a common line in parallel with the gate line; first and second common line patterns extending from the common line, wherein the data line is between the first and second common line patterns; a thin film transistor connected to the gate and data lines; a pixel electrode connected to the thin film transistor and in the pixel region; and an inorganic black matrix below the gate line, the common line, and the first and second common lines, wherein the inorganic black matrix below the first and second common lines shields the data line; an opposing substrate including a common electrode on a second substrate; and a liquid crystal layer between the array substrate and the opposing substrate.

7 Claims, 6 Drawing Sheets

LIQUID CRYSTAL DISPLAY DEVICE AND METHOD OF MANUFACTURING THE SAME

This application claims the benefit of Korea Patent Application No. 10-2010-0042018, filed on May 4, 2010, the entire contents of which is incorporated herein by reference for all purposes as if fully set forth herein.

BACKGROUND

1. Field of the Invention

The present disclosure relates to a liquid crystal display device, and more particularly, to a liquid crystal display device and a method of manufacturing the same.

2. Discussion of the Related Art

Until recently, display devices have typically used cathode-ray tubes (CRTs). Presently, many efforts and studies are being made to develop various types of flat panel displays, such as liquid crystal display (LCD) devices, plasma display panels (PDPs), field emission displays, and electro-luminescence displays (ELDs), as a substitute for CRTs. Of these flat panel displays, LCD devices have many advantages, such as high resolution, light weight, thin profile, compact size, and low voltage power supply requirements.

In general, an LCD device includes two substrates that are spaced apart and face each other with a liquid crystal material interposed between the two substrates. The two substrates include electrodes that face each other such that a voltage applied between the electrodes induces an electric field across the liquid crystal material. Alignment of the liquid crystal molecules in the liquid crystal material changes in accordance with the intensity of the induced electric field into the direction of the induced electric field, thereby changing the light transmissivity of the LCD device. Thus, the LCD device displays images by varying the intensity of the induced electric field.

FIG. 1 is a cross-sectional view illustrating an LCD device according to the related art.

Referring to FIG. 1, the LCD device includes a liquid crystal panel 10 including an array substrate, a color filter substrate and a liquid crystal layer 50 therebetween, and a backlight below the liquid crystal panel 10.

The array substrate 10 includes a gate line (not shown) and a data line 4 on a first substrate 1 that cross each other to define a pixel region P. A thin film transistor Tr is formed in a switching region TrA near the crossing portion of the gate line and the data line 4. A pixel electrode 24 is formed in a display region AA to substantially display images and connected to the thin film transistor Tr.

The thin film transistor Tr includes a gate electrode 11, a gate insulating layer 13, a semiconductor layer 15, and source and drain electrodes 17 and 19.

A passivation layer 21 is formed on the first substrate 1 having the thin film transistor Tr, and the pixel electrode 24 is formed on the passivation layer 21 and connected to the drain electrode 19.

The color filter substrate includes a black matrix 32 made of black resin on a second substrate 2. The black matrix 32 shields the non-display elements such as the gate line, the data line 4 and the thin film transistor and exposes the pixel electrode 24.

Red (R), green (G) and blue color filters 34 are formed corresponding to respective openings of the black matrix 32. A common electrode 36 is formed on the color filter 34 and the black matrix 32.

In the LCD device, abnormal distribution of electric field occurs around step portions made due to electrodes and lines, and this causes liquid crystal molecules to be operated abnormally. Accordingly, light leakage occurs around the step portions.

The black matrix 32 is located corresponding to regions, where the abnormally-operated liquid crystal molecules exist, for example, the gate line and the data line 4 to prevent the light leakage.

Further, the black matrix 32 extends such that the black matrix 32 covers portions of the pixel electrodes 24 at both sides of the data line 4 as well as the data line 4.

For example, the black matrix 32 is configured to have a VAC (viewing angle crosstalk) margin D to prevent the VAC defect which is that light leakage is seen according to viewing angles of a viewer through a separate region between the data line 4 and the pixel electrode 24. However, in this case, aperture ratio is reduced.

To resolve the problems, a structure shown in FIG. 2 is suggested. Referring to FIG. 2, a common line 6 overlapping a pixel electrode to form a storage capacitor is formed below the data line 4. This structure functions to block light leakage through the separate region between the data line 4 and the pixel electrode 24, and thus the VAC defect is prevented. In this case, the black matrix 32 does not need the VAC margin (D of FIG. 1), and thus aperture ratio is improved.

However, in the device of FIG. 2, since the common line 6 is below the data line 4, the common line 6 and the data line 4 create a parasitic capacitance with the gate insulating layer 13 as a dielectric. The parasitic capacitance functions as a resistor and causes signal delay and increase of current consumption. Accordingly, reliability is reduced, and disconnection of the data line is caused.

BRIEF SUMMARY

A liquid crystal display device includes an array substrate including: gate and data lines crossing each other on a first substrate to define a pixel region; a common line in parallel with the gate line; first and second common line patterns extending from the common line, wherein the data line is between the first and second common line patterns; a thin film transistor connected to the gate and data lines; a pixel electrode connected to the thin film transistor and in the pixel region; and an inorganic black matrix below the gate line, the common line, and the first and second common lines, wherein the inorganic black matrix below the first and second common lines shields the data line; an opposing substrate including a common electrode on a second substrate; and a liquid crystal layer between the array substrate and the opposing substrate.

In another aspect, a method of manufacturing a liquid crystal display device includes forming an inorganic black matrix on a first substrate, and a gate line, a gate electrode, a common line, and first and second common line patterns on the inorganic black matrix; forming a gate insulating layer on the gate line, the gate electrode, the common line, and the first and second common line patterns; forming an active layer and an ohmic contact layer on the gate insulating layer, a data line, and source and drain electrodes, wherein the data line is between the first and second common line patterns and over the inorganic black matrix and defines a pixel region with the gate line crossing the data line; forming a passivation layer on the source and drain electrodes; and forming a pixel electrode on the passivation layer and connected to the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE DRAWINGS AND THE PRESENTLY PREFERRED EMBODIMENTS

Reference will now be made in detail to the illustrated embodiments of the present invention, which are illustrated in the accompanying drawings.

Figure 1:
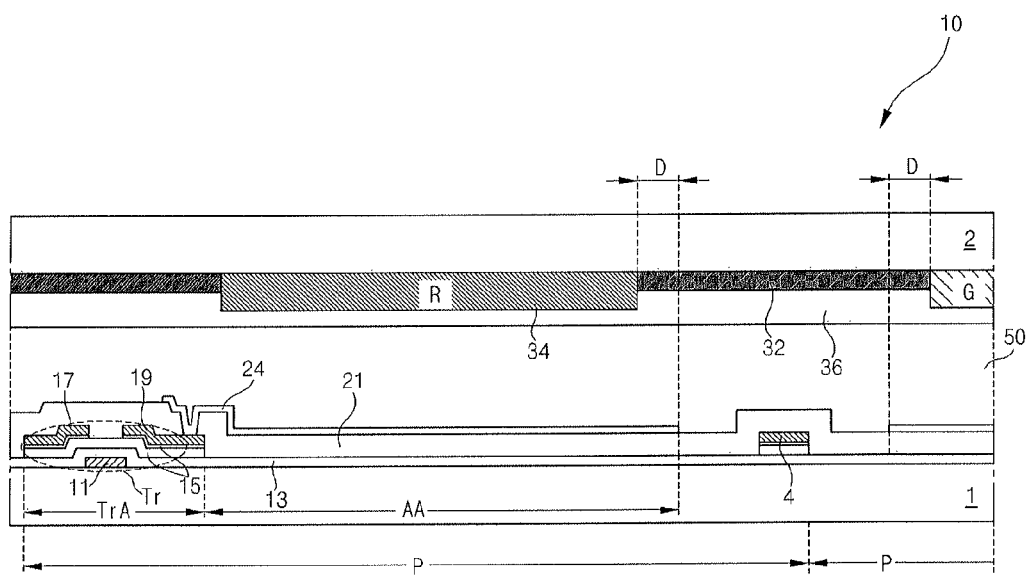
FIG. 1 is a cross-sectional view illustrating an LCD device according to the related art.
Figure 2:
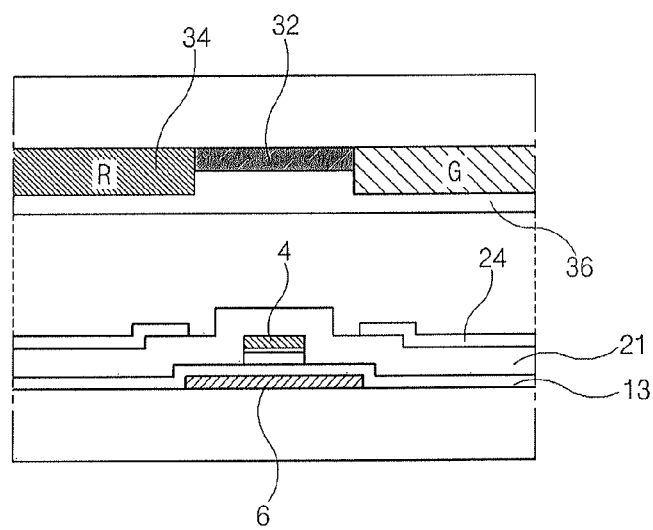
FIG. 2 is a cross-sectional view illustrating an LCD device having a structure to prevent a VAC defect according to the related art.
Figure 3:
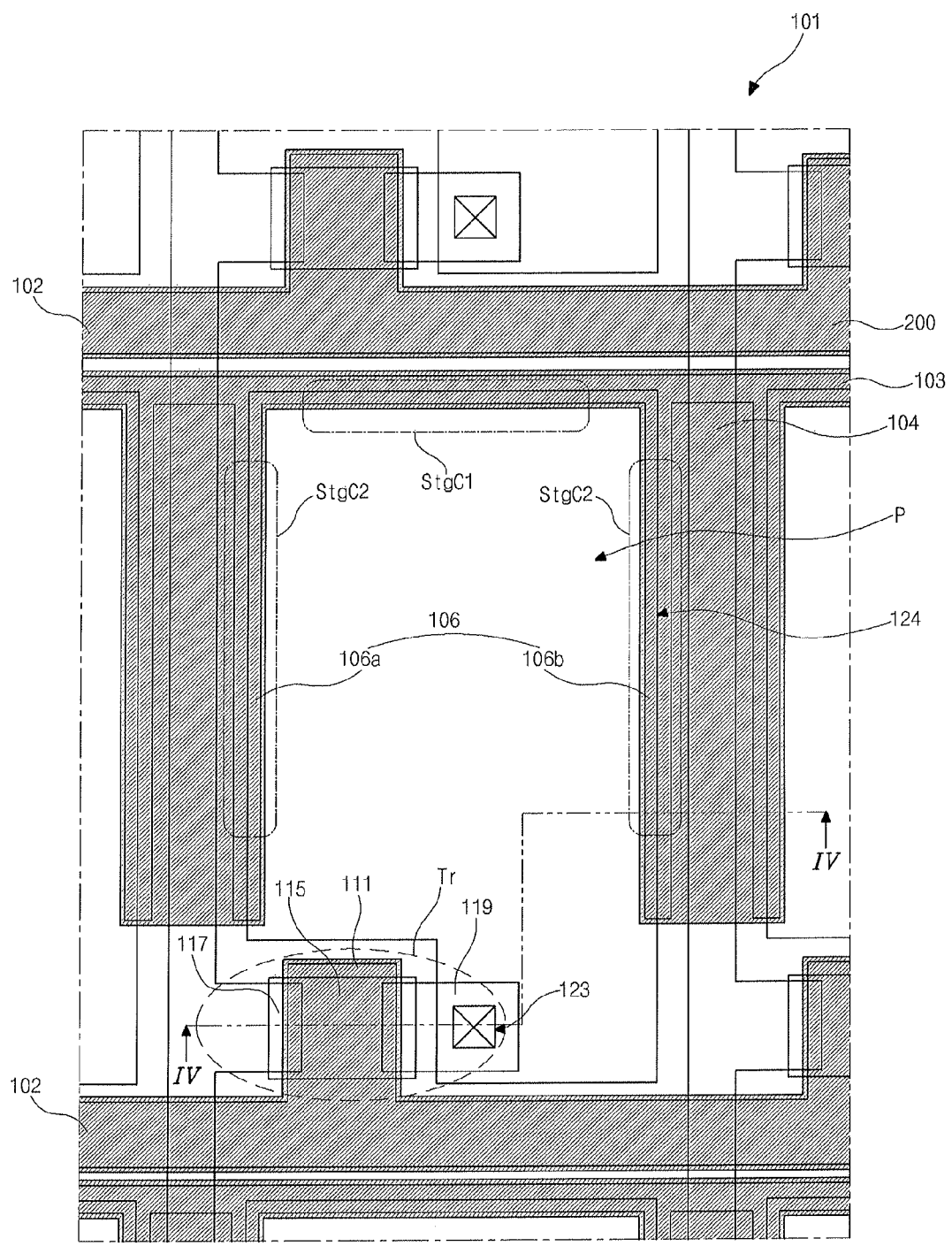
FIG. 3 is a plan view illustrating an LCD device according to an embodiment of the present invention.
Figure 4:
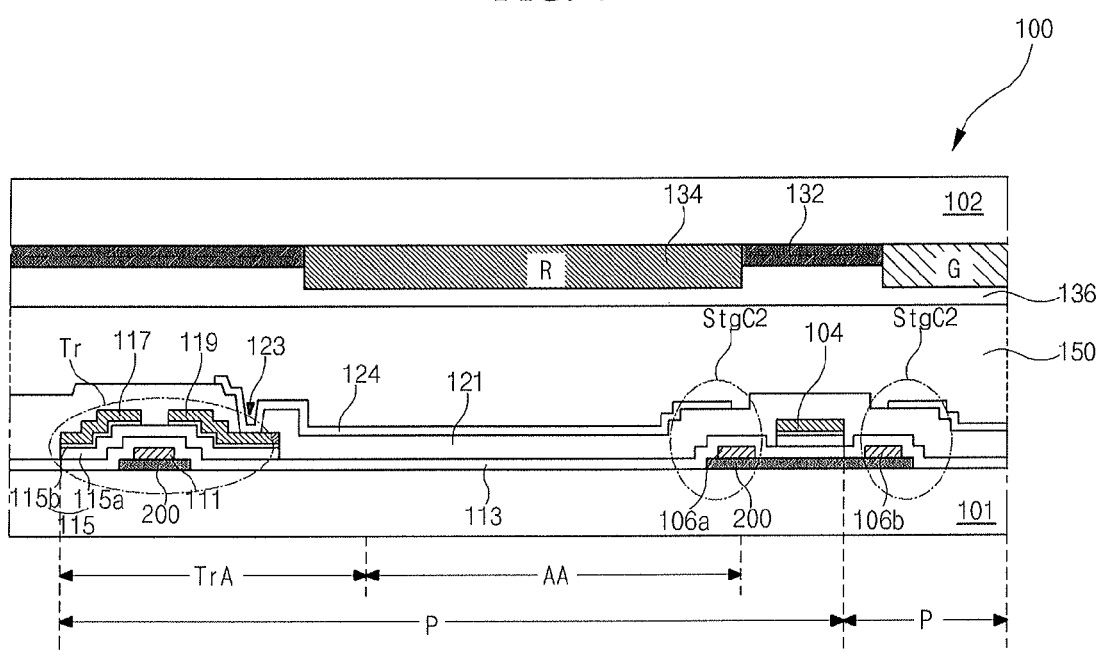
FIG. 4 is a cross-sectional view taken along a line IV-IV of FIG. 3.

FIG. 3 is a plan view illustrating an LCD device according to an embodiment of the present invention, and FIG. 4 is a cross-sectional view taken along a line IV-IV of FIG. 3.

Referring to FIGS. 3 and 4, the LCD device 100 includes an array substrate, a color filter substrate, and a liquid crystal layer 150 between the array substrate and the color filter substrate.

In the array substrate, a gate line 102 and a data line 104 are formed on a first substrate and cross each other to define a pixel region P. A thin film transistor Tr is formed at the crossing portion of the gate and data lines 102 and 104. The thin film transistor Tr includes a gate electrode 111, a gate insulating layer 113, a semiconductor layer 115, and source and drain electrodes 117 and 119.

A pixel electrode 124 is formed in the pixel region P and connected to the drain electrode 119 of the thin film transistor Tr through a drain contact hole 123.

A common line 103, and first and second common line patterns 106a and 106b are formed on the first substrate 101. The common line 103 is spaced apart from and in parallel with the gate line 102. The first and second common line patterns 106a and 106b extends from the common line 103, and are in parallel with the data line 104 and at both sides of the data line 104.

The common line 103 and the pixel electrode 124 overlapping each other function as a first storage electrode and a second storage electrode, respectively, and form a first storage capacitor StgC1 Each of the first and second common line patterns 106a and 106b and the pixel electrode 124 overlapping each other function as a third storage electrode and a fourth storage electrode, respectively and form a second storage capacitor StgC2.

An inorganic black matrix 200 made of inorganic material is formed below the gate and data lines 102 and 104, the gate electrode 111, the common line 103, and the first and second common line patterns 106a and 106b.

The inorganic black matrix 200 blocks light through a region between the data line 104 and the pixel electrode 124. Accordingly, VAC (viewing angle crosstalk) defect can be prevented.

Thus, a black matrix 132 in the color filter substrate does not need a VAC margin. As a result, aperture ratio can be improved.

Further, since the inorganic black matrix 200 is formed below the data line 104, a common electrode to prevent light leakage, as described in the related art, is not needed. This prevents a parasitic capacitance between the data line 104 and the common line 103. Therefore, signal delay and increase of current consumption of the related art can be prevented.

Referring to FIG. 4, a switching region TrA, where the thin film transistor Tr is formed, and a display region AA to display images are defined.

The gate electrode 111 is formed in the switching region TrA on the first substrate 101 and extends from the gate line 102. The common line 103 may be located at the display region AA.

The first and second common line patterns 106a and 106b are located at the outermost portions of the pixel region P and in parallel with the data line 104.

The gate line 102, the gate electrode 111, the common line 103, and the first and second common line patterns 106a and 106b may be made of a material having a low resistance, for example, molybdenum (Mo), aluminum (Al). aluminum alloy (e.g., AlNd), copper (Cu), or copper alloy.

The inorganic black matrix 200 below the first and second common line patterns 106a and 106b may be located corresponding to a region between the first and second common line patterns 106a and 106b at both sides of the data line 104.

The inorganic black matrix 200 functions to prevent light leakage through a region between the data line 104 and the pixel electrode 124. In more detail, the inorganic black matrix 200 may have a shape to surround peripheral portions of the display region AA.

In other words, the inorganic black matrix 200 corresponds to the gate line 102, the thin film transistor Tr, the data line 104, the first and second common line patterns 106a and 106b, and a region between the first and second common line patterns 106a and 106b at both sides of the data line 104.

The gate insulating layer 113 is formed on the gate line 102, the common line 103, and the first and second common line patterns 106a and 106b.

The semiconductor layer 115 and the source and drain electrodes 117 and 119 are formed on the gate insulating layer 113 over the gate electrode 111. The data line 104 is formed on the gate insulating layer 113.

The semiconductor layer 115 includes an active layer 115a made of intrinsic amorphous silicon, and an ohmic contact layer 115b made of extrinsic amorphous silicon.

The gate electrode 111, the gate insulating layer 113, the semiconductor layer 115, and the source and drain electrodes 117 and 119 forms the thin film transistor Tr.

The pixel electrode 124 extends over and overlaps the first and second common line patterns 106a and 106b to form the second storage capacitor StgC2 with the gate insulating layer 113 therebetween as a dielectric.

The data line 104 is located at a boundary portion between the adjacent pixel regions P. In other words, the data line 104 is between the first and second common line patterns 106a and 106b, and over the inorganic black matrix 200 between the first and second common line patterns 106a and 106b.

An intrinsic amorphous silicon pattern and an extrinsic amorphous silicon pattern, which are the same material as the active layer 115a and the ohmic contact layer 115b, respectively, are formed below the data line 104. Alternatively, the intrinsic amorphous silicon pattern and the extrinsic amorphous silicon pattern may be omitted.

A passivation layer 121 is formed on the data line 104 and the source and drain electrodes 117 and 119. The passivation layer 121 may be made of an inorganic insulating material.

The pixel electrode 124 is formed on the passivation layer 121 and contacts the drain electrode 119 through the drain contact hole 123 in the passivation layer 121.

The black matrix 132 made of an organic black resin is formed on a second substrate 102. The black matrix 132 has a lattice shape to shield non-display elements of the array substrate, such as the gate line 102, the data line 104, and the thin film transistor Tr, and to expose the pixel electrode 124. The black matrix 132 may be referred to as a resin black matrix.

Red (R), green (G) and blue (B) color filters 134 fills respectively openings of the resin black matrix 132. A common electrode 136 is formed on the resin black matrix 132 and the color filters 134.

As described above, the inorganic black matrix 200 is formed below the first and second common line patterns 106a and 106b, and the data line 104 is formed over the inorganic black matrix 200 corresponding to the region between the first and second common line patterns 106a and 106b. Accordingly, the VAC defect can be prevented.

Therefore, the resin black matrix 132 does not have the VAC margin of the related art. As a result, aperture ratio can be improved.

Further, since the inorganic black matrix 200 is formed below the data line 104, a common electrode to prevent light leakage, as described in the related art, is not needed. This prevents a parasitic capacitance between the data line 104 and the common line 103. Therefore, signal delay and increase of current consumption of the related art can be prevented.

The inorganic black matrix 200 may be made of one selected from a germanium group including germanium (Ge), germanium carbide (GeC) and germanium silicon (GeSi).

The inorganic black matrix 200 can be formed thinner in thickness than a black matrix made of black resin. Accordingly, a rubbing defect due to a step portion can be prevented. In more detail, in case of using the black matrix made of black resin, a step portion is caused because the black matrix made of black resin is formed relatively thick, and this causes rubbing defect.

The black matrix made of black resin should be formed relatively thick because of following reasons. The black matrix should have a certain optical density (OD), which is expressed by a following formula (1): OD=−log(Iout/Iin) (where Iin is an amount of light incident, and Iout is an amount of light emitted).

A black matrix should have an amount of light of about 4.0 or more, and more preferably, about 5.0 or more, to improve contrast by suppression of color mixture and to prevent abnormal operation of the thin film transistor Tr due to light leakage.

However, the black matrix made of black resin should have a thickness of about 1 μm to about 2 μm to have the optical density of 4.0 or more. Accordingly, in case that the black matrix of black resin is formed in the array substrate, a relatively great step portion is formed and the rubbing defect is caused. Further, a planarization process is additionally needed to prevent the rubbing defect.

In case of the inorganic black matrix 200 of the embodiment, even though the inorganic black matrix 200 has a thickness of about 2000 Å to about 5000 Å, the inorganic black matrix 200 has an optical density of about 4.0 or more. It is preferred that the inorganic black matrix has a thickness of about 3000 Å. Therefore, the inorganic black matrix 200 can be formed relatively thinner to have the similar optical density, compared to the black matrix made of black resin. The inorganic black matrix 200 may have an optical density of about 5.3 at a wavelength of about 550 nm.

The inorganic black matrix 200 as above is formed in the array substrate, and functions to prevent light leakage between the pixel electrode 124 and each of the lines 102 and 104. Accordingly, the VAC defect can be prevented, and the VAC margin is not needed. Therefore, aperture ratio can be improved.

Further, the inorganic black matrix 200 may have a specific resistivity of about E+15 Ωcm or more. Accordingly, even though the inorganic black matrix 200 is formed below the data line 104, a parasitic capacitance between the data line 104 and the inorganic black matrix 200 is not caused. Therefore, signal delay and increase of current consumption due to the parasitic capacitance can be prevented.

Although not shown in the drawings, the inorganic black matrix 200 below the gate electrode 111 may be formed to have a size greater than a size of the semiconductor layer 115 to prevent light from being incident on the semiconductor layer 115. In this case, the resin black matrix 132 may be omitted.

In forming the inorganic black matrix 200, an additional photo mask may be not used.

A method of manufacturing the array substrate of the LCD device of the embodiment is explained with reference to FIGS. 5A to 5I.

FIGS. 5A to 5I are cross-sectional views illustrating a method of the array substrate of the LCD device according to the embodiment of the present invention.

Figure 5A:
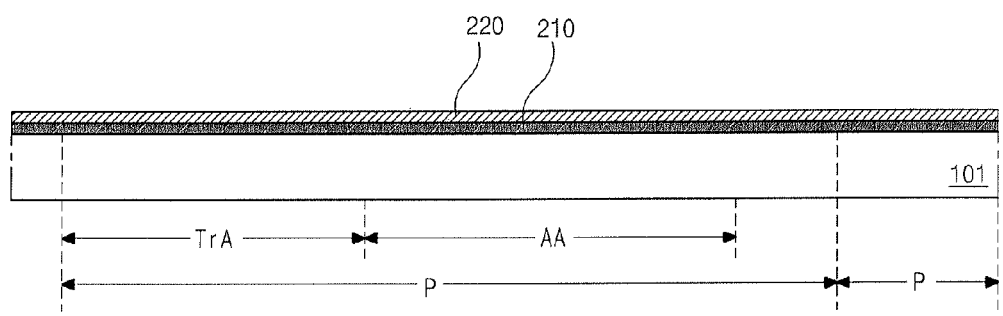
FIGS. 5A to 5I are cross-sectional views illustrating a method of the array substrate of the LCD device according to the embodiment of the present invention.

Referring to FIG. 5A, a black matrix layer 210 made of an inorganic material and a first metal layer 220 made of a material having a low resistance are sequentially formed on a substrate 101.

The inorganic material may be selected from a germanium group including germanium (Ge), germanium carbide (GeC) and germanium silicon (GeSi). The first metal material may be molybdenum (Mo), aluminum (Al), aluminum alloy (e.g., AlNd), copper (Cu), or copper alloy.

Figure 5B:
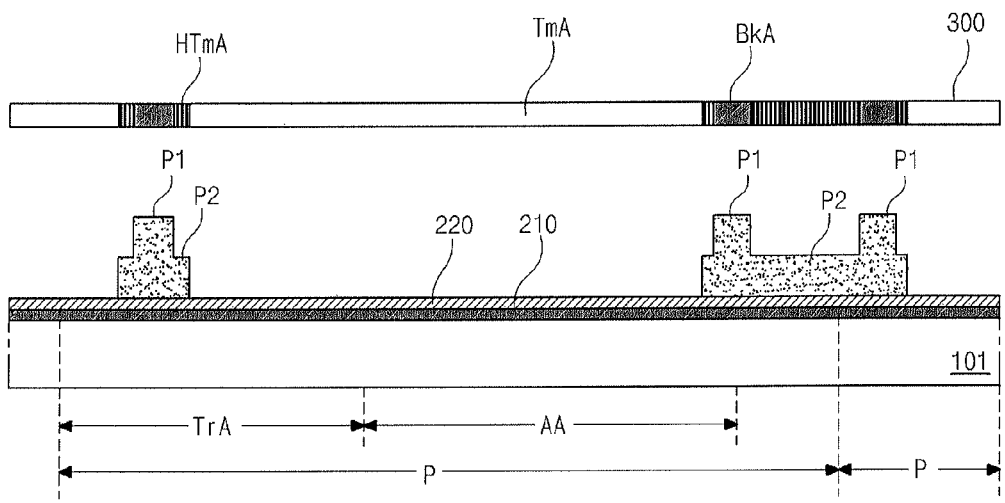

Referring to FIG. 5B, a photoresist layer (not shown) is formed on the first metal layer 220, and a photo mask 300 is located over the photoresist layer. Then, light exposure is performed. The photo mask 300 includes a transmissive portion (TmA), a blocking portion (BkA), and a semi-transmissive portion (HTmA) that has a transmittance more than a transmittance of the blocking portion (BkA) and less than a transmittance of the transmissive portion (TmA).

The blocking portion (BkA) corresponds to regions where a gate electrode (111 of FIG. 4), first and second common line patterns (106a and 106b of FIG. 4), a gate line (102 of FIG. 3), and a common line (103 of FIG. 3) are formed. The semi-transmissive portion (HTmA) corresponds to a region of both sides of the gate electrode 111, a region between the first and second common line patterns 106a and 106b, a region of outer sides of the first and second common line patterns 106a and 106b. The transmissive portion (TmA) may correspond to regions except for the regions corresponding to the blocking portion (BkA) and the semi-transmissive portion (HTmA).

The light-exposed photoresist layer is developed to form first and second photoresist patterns P1 and P2 corresponding to the blocking portion (BkA) and the semi-transmissive portion (HTmA), respectively. The photoresist layer corresponding to the transmissive portion (TmA) is removed so that the first metal layer 220 therebelow is exposed. The second photoresist pattern P2 has a second thickness less than a first thickness of the first photoresist pattern P1.

Figure 5C:
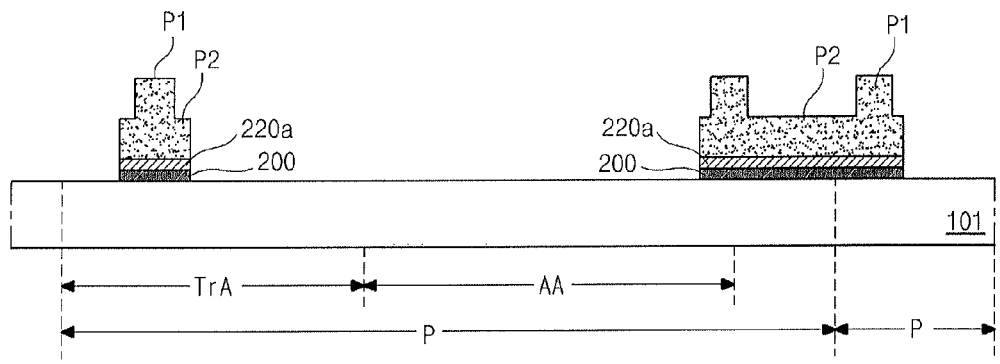

Referring to FIG. 5C, the first metal layer 220 and the black matrix layer 210 are removed through an etching process using the first and second photoresist patterns P1 and P2 as an etching mask. Accordingly, a metal pattern 220a and an inorganic black matrix 200 therebelow are formed.

Figure 5D:
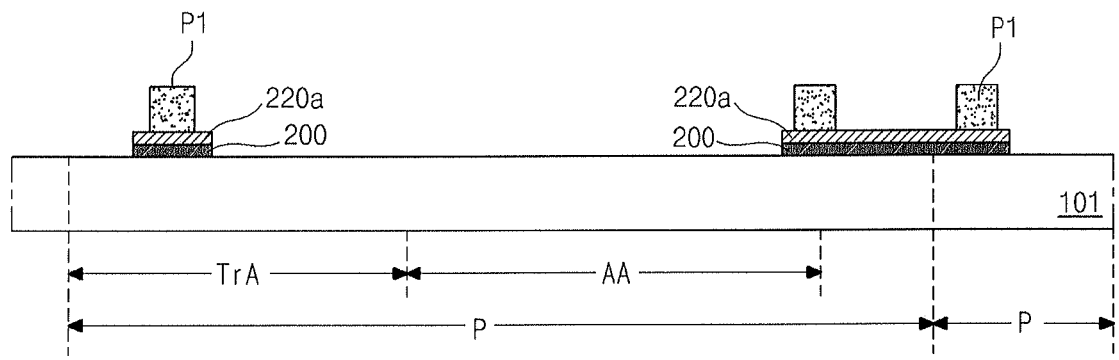

Referring to FIG. 5D, an ashing process is performed to remove the second photoresist pattern P2. In the ashing process, the first photoresist pattern P1 is reduced in thickness.

Figure 5E:
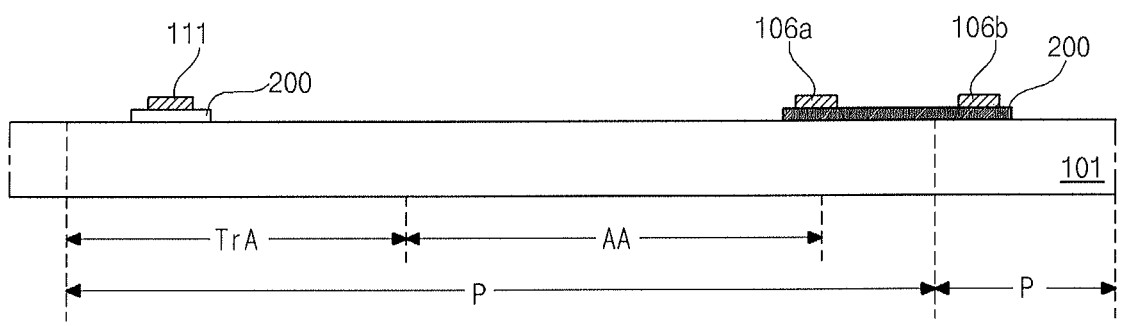

Referring to FIG. 5E, the metal pattern 220a is removed through an etching process using the second photoresist pattern P2 as an etching mask. Accordingly, the gate electrode 111 and the first and second common line patterns 106a and 106b are formed over the inorganic black matrix 200.

As described above, the inorganic black matrix 200 is formed in the mask process of forming the gate electrode 111 and the first and second common line patterns 106a and 106b. Accordingly, an additional mask process to form the inorganic black mask 200 is not needed.

Although not described in detail, the gate line 102 and the common line 103 are formed in the above mask process.

Figure 5F:
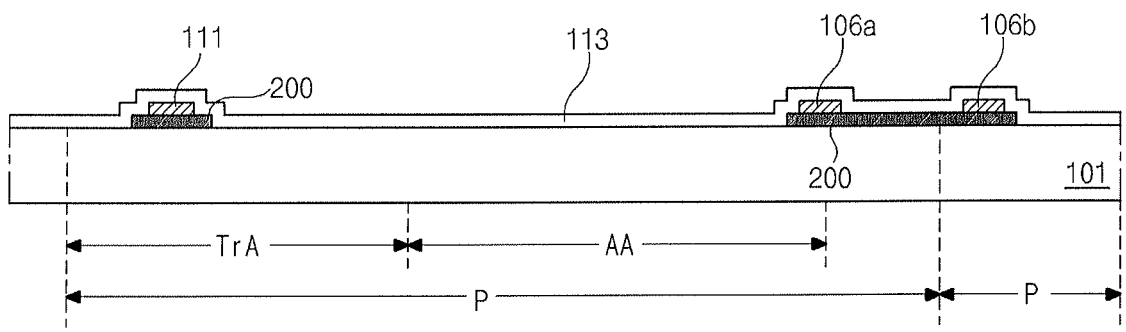

Referring to FIG. 5F, a gate insulating layer 113 is formed on the substrate 101 having the gate electrode 111 and the first and second common line patterns 106a and 106b. The gate insulating layer 113 may be made of an inorganic insulating material, for example, silicon oxide ($SiO_2$) or silicon nitride (SiNx).

Figure 5G:
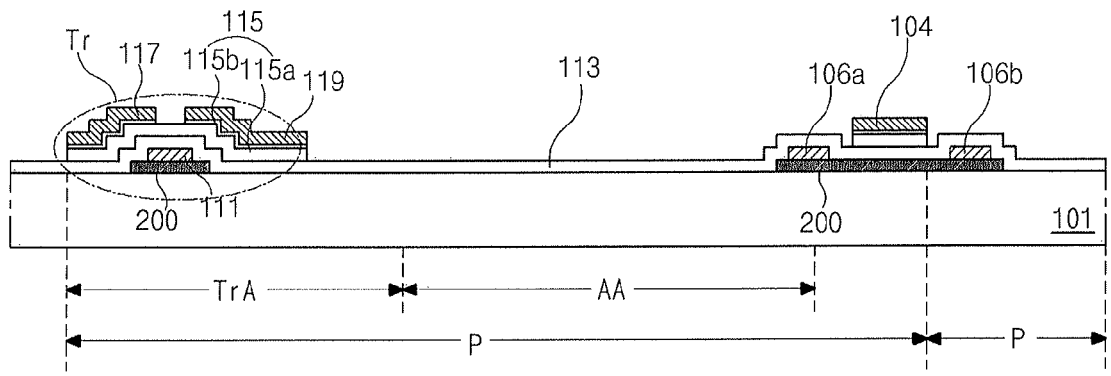

Referring to FIG. 5G, an intrinsic amorphous silicon layer (not shown), an extrinsic amorphous silicon layer (not shown), and a second metal layer (not shown) are sequentially formed on the gate insulating layer 113, and then a mask process is performed. The mask process may include forming a photoresist layer on the second metal layer, light exposure, developing, etching, stripping and so on. Through the mask process, a data line 104 and source and drain electrodes 117 and 119 are formed. The data line 104 defines a pixel region P with the gate line 102 crossing the data line 104.

The extrinsic amorphous silicon layer exposed between the source and drain electrodes 117 and 119 is dry-etched to form an ohmic contact layer 115b. An active layer 115a made of intrinsic amorphous silicon is formed below the ohmic contact layer 115b in the mask process. Accordingly, a semiconductor layer 115 including the active layer 115a and the ohmic contact layer 115b is formed.

The gate electrode 111, the gate insulating layer 113, the semiconductor layer 115, and the source and drain electrodes 117 and 119 form a thin film transistor Tr in the switching region TrA.

Figure 5H:
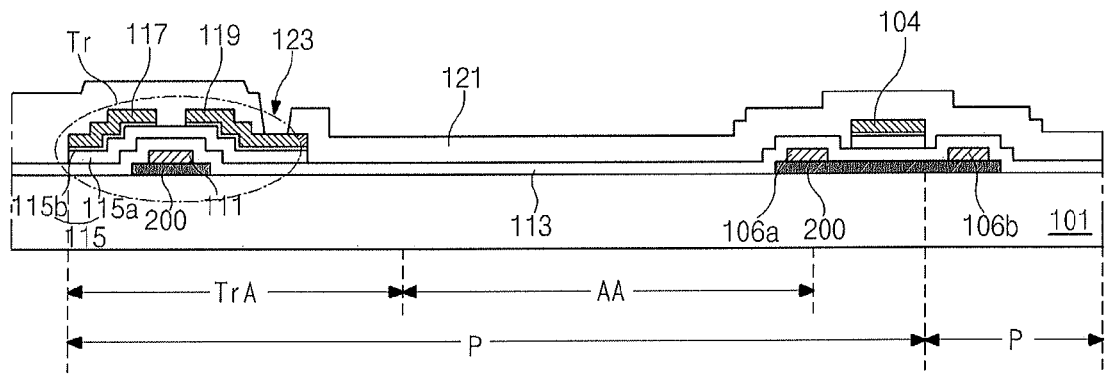

Referring to FIG. 5H, a passivation layer 121 is formed on the substrate 101 having the source and drain electrodes 117 and 119 and the data line 104. The passivation layer 121 is patterned to form a drain contact hole 123 exposing the drain electrode 119. The passivation layer 123 may be made of an inorganic insulating material, for example, silicon oxide ($SiO_2$) or silicon nitride (SiNx), or an organic insulating material, for example, benzocyclobutene (BCB) or photo acrylic.

Figure 5I:
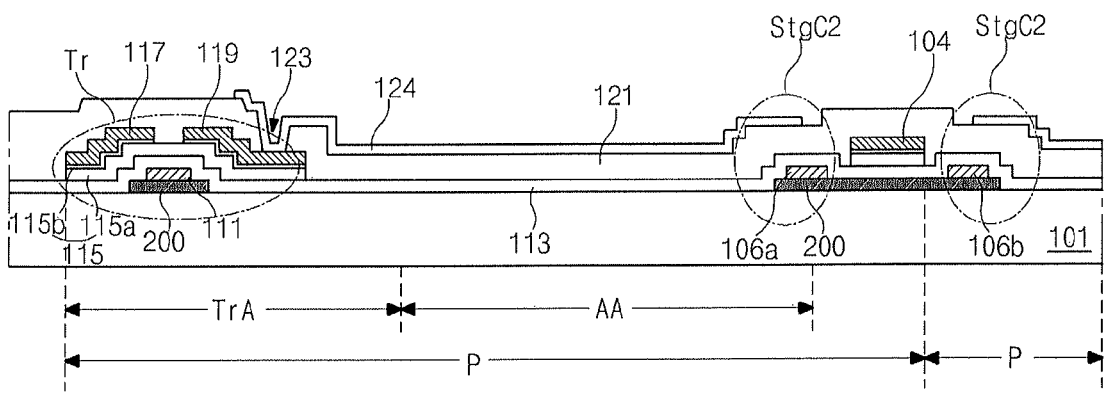

Referring to FIG. 5I, a transparent conductive material layer (not shown) is formed on the passivation layer 123. The transparent conductive material may be indium-tin-oxide (ITO), indium-zinc-oxide (IZO), or indium-tin-zinc-oxide (ITZO).

The transparent conductive material layer is patterned to form a pixel electrode 124 in the pixel region P, which contacts the drain electrode 119 through the drain contact hole 123.

Through the above-described processes, the array substrate is manufactured. The array substrate is coupled with an opposing substrate, for example, the color filter substrate with the liquid crystal layer (150 of FIG. 4) therebetween, and thus the LCD device is manufactured.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A liquid crystal display device, comprising:
    an array substrate including:
        gate and data lines crossing each other on a first substrate to define a pixel region;
        a common line in parallel with the gate lines;
        first and second common line patterns extending from the common line,
    wherein the data line is between the first and second common line patterns;
        a thin film transistor connected to the gate and data lines;
        a pixel electrode connected to the thin film transistor and in the pixel region; and
        an inorganic black matrix below the gate lines, the common line, and the first and second common line patterns, wherein the inorganic black matrix below the first and second common line patterns shields the data line;
    an opposing substrate including a common electrode on a second substrate; and
    a liquid crystal layer between the array substrate and the opposing substrate.

2. The device according to claim 1, wherein the inorganic black matrix is made of an inorganic material containing germanium (Ge).

3. The device according to claim 1, wherein the inorganic black matrix has a specific relativity of about E+15 Ωcm or more.

4. The device according to claim 1, wherein the inorganic black matrix has an optical density of about 5.3 at a wavelength of about 550 nm.

5. The device according to claim 1, wherein the inorganic black matrix has a thickness of about 2000 Å to about 5000 Å.

6. The device according to claim 1, wherein the thin film transistor includes a respective gate electrode connected to a respective gate line, a gate insulating layer, a semiconductor layer, and source and drain electrodes, and wherein the drain electrode is connected to the pixel electrode.

7. The device according to claim 1, wherein the opposing substrate further includes a black matrix made of resin, and a color filter filling an opening of the black matrix made of resin.

* * * * *